(12) United States Patent
Karp

(10) Patent No.: US 6,316,132 B1
(45) Date of Patent: Nov. 13, 2001

(54) STRUCTURE AND METHOD FOR PREVENTING BARRIER FAILURE

(75) Inventor: James Karp, Saratoga, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/389,845

(22) Filed: Sep. 2, 1999

(51) Int. Cl.$^7$ .......................... H01L 23/48; H01L 23/52; B32B 15/01

(52) U.S. Cl. .......................... 428/698; 428/450; 428/446; 428/641; 428/699; 257/753; 257/764

(58) Field of Search .................................. 428/620, 627, 428/628, 629, 632, 633, 655, 660, 665, 469, 472.1, 693, 698, 699, 623; 438/637, 644, 656, 641, 653, 654, 675, 685, 681, 450, 446

(56) References Cited

U.S. PATENT DOCUMENTS

| | | | |
|---|---|---|---|
| 5,489,552 | * | 2/1996 | Merchant et al. . |
| 5,552,339 | * | 9/1996 | Hsieh et al. . |
| 5,599,739 | * | 2/1997 | Merchant et al. . |
| 5,654,589 | * | 8/1997 | Huang et al. . |
| 5,672,543 | * | 9/1997 | Chang et al. . |
| 5,674,781 | * | 10/1997 | Huang et al. . |
| 5,801,095 | * | 9/1998 | Huang et al. . |
| 5,847,463 | * | 12/1998 | Trivedi et al. . |
| 5,981,380 | * | 11/1999 | Trivedi et al. . |
| 6,093,645 | * | 7/2000 | Ameen et al. . |
| 6,096,640 | * | 8/2000 | Hu . |
| 6,136,697 | * | 10/2000 | Wu . |
| 6,146,742 | * | 11/2000 | Hsieh et al. . |

OTHER PUBLICATIONS

"ULSI Technology" edited by C. Y. Chang and s. M. Sze, Chapter 8, "Metallization", published by The McGraw–Hill Companies, Inc., copyright 1996, pp. 371–471.

* cited by examiner

Primary Examiner—Deborah Jones
Assistant Examiner—Jennifer McNeil
(74) Attorney, Agent, or Firm—Bever Hoffman & Harms, LLP

(57) ABSTRACT

A structure and method to prevent barrier failure is provided. The present invention replaces a standard titanium-nitride (TiN) barrier metal layer with two separately-formed TiN layers. The two TiN layers provide smaller, mismatched grain boundaries. During subsequent tungsten deposition using $WF_6$, the $WF_6$ finds it difficult to penetrate through the mismatched grain boundaries, thereby minimizing any possibility of "tungsten volcano". One embodiment includes a native or a grown oxide formed between the two TiN layers, thereby providing yet another diffusion barrier to the $WF_6$ and acting as a glue layer between the two TiN layers. The present invention provides a thin and strong barrier metal layer with minimal barrier failures.

18 Claims, 1 Drawing Sheet

STRUCTURE AND METHOD FOR PREVENTING BARRIER FAILURE

FIELD OF THE INVENTION

The present invention relates generally to metalization, and more particularly to a structure and method for preventing a phenomena called "tungsten volcano".

BACKGROUND OF THE INVENTION

Metalization is an integrated circuit structure that connects individual devices by metal wires to form circuits. Pressure to decrease die area affects all circuits and circuit-related processes, including metalization. Specifically, in current chips, metal wires now carry electrical currents in the milliampere range, thereby resulting in extremely high current density. Therefore, defects in these metal wires can significantly impact the performance of the individual devices, the resulting circuits, and the chip itself. Thus, the goal of any metalization or associated process is to minimize both the number and size of such defects.

One of the most difficult problems in metalization is ensuring appropriate metal continuity at contact windows and vias. FIG. 1 illustrates a cross section 100 of a semiconductor device including two contact windows 101. To form the plugs within windows 101, three layers are typically provided: a titanium layer 102, a titanium-nitride (TiN) layer 103, and a tungsten layer 104. Titanium layer 102 acts as a glue layer between the underlying structures and TiN layer 103. As known to those skilled in the art, titanium-nitride is used as a nucleation layer to facilitate formation of tungsten layer 104. Tungsten, a refractory metal, provides a plug with low resistance to underlying layers and to subsequent metal layers, typically including aluminum (not shown). Tungsten layer 104 is typically formed through silane reduction of $WF_6$.

Unfortunately, titanium reacts readily with $WF_6$. Those skilled in the art have surmised that defects in TiN layer 103 allow $W_6$ to penetrate TiN layer 103 and to react with titanium layer 102 to form a defect known as "tungsten volcano". TiN layer 103, which is generally formed by sputter-deposition, has a high stress point at the edge of a "step" 105 (i.e. the edge of a contact window). This stress may affect other areas of TiN layer 103, thereby resulting in numerous pin holes and cracks throughout TiN layer 103. TiN layer 103 tends to be porous at such steps, cracks, and pin holes and thus more vulnerable to $WF_6$ penetration at these locations.

FIG. 2 illustrates the resulting peel back of TiN layer 103 after the fluorine reacts with titanium layer 102. During this reaction, the tungsten continues to be deposited irrespective of the peeling of TiN layer 103. Thus, tungsten forms on both sides of the peeling portion and eventually forms tungsten volcano 106, usually greater than 1 micron in size. For additional details regarding this phenomena, see *ULSI Technology*, by C. Y. Chang and S. M. Sze, pages 371–471, published by McGraw-Hill in 1996. A subsequent RIE etch cannot remove these volcanoes, thereby resulting in intra- or interlevel metal shorts.

SUMMARY OF THE INVENTION

A structure and method to prevent barrier failure is provided. The present invention replaces the standard titanium-nitride (TiN) barrier metal layer with two separately-formed TiN layers. The two TiN layers provide smaller and mismatched grain boundaries. During subsequent tungsten deposition using $W_6$, the $WF_6$ finds it difficult to penetrate through these mismatched grain boundaries, thereby significantly minimizing the possibility of reacting with the underlying layer and forming a tungsten volcano. One embodiment includes a native or a grown oxide formed between the two TiN layers, thereby providing yet another diffusion barrier to the $WF_6$ and acting as a glue layer between the two TiN layers. The present invention provides a thin and strong barrier metal layer with minimal barrier failures.

DETAILED DESCRIPTION OF THE DRAWINGS

Figure 1:
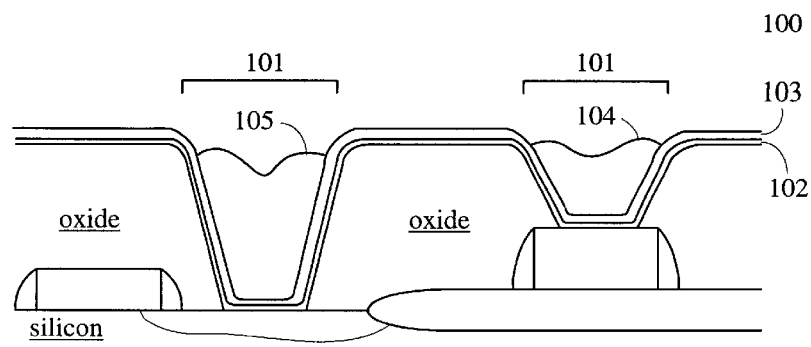
FIG. 1 illustrates a cross section of a semiconductor structure including two contact windows with standard plugs formed therein.
Figure 2A:
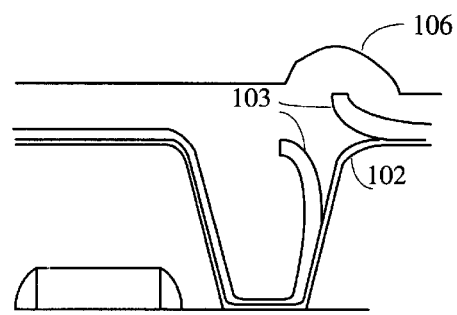
FIG. 2A illustrates a cross section of one plug of FIG. 1 having a tungsten volcano.
Figure 2B:
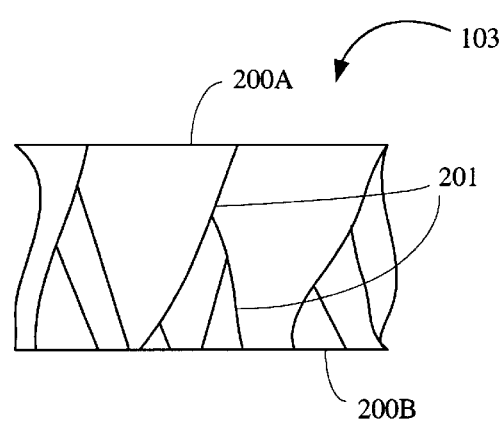
FIG. 2B illustrates a cross section of a standard barrier metal layer and its associated grains.

The present invention takes advantage of the grain boundaries of the barrier metal layer. FIG. 2B illustrates the large grain boundaries 201 of TiN layer 103. During tungsten deposition using $W_6$, the $W_6$ penetrates through TiN layer 103 via one or more grain boundaries 201 which extend from the top surface 200A to the bottom surface 200B.

Figure 3:
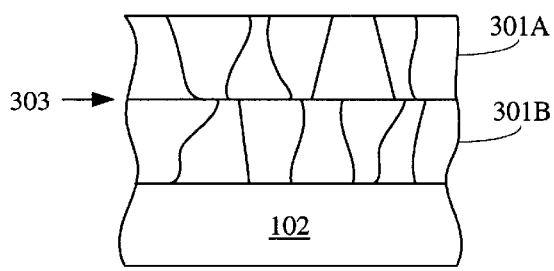
FIG. 3 illustrates a composition barrier metal layer in accordance with the present invention.

In accordance with the present invention, standard titanium-nitride (TiN) barrier metal layer 103 is replaced with two separately-formed TiN layers. The size of the grain boundaries of a film is proportional to the film thickness. Thus, as shown in FIG. 3, TiN layer 301A and TiN layer 301B each have smaller grain boundaries than standard TiN layer 103. Moreover, of importance, the respective grain boundaries of each TiN layer 301 are mismatched at interface 303. Therefore, TiN layers 103 become substantially amorphous in nature. In this manner, during subsequent tungsten deposition using $W_6$, the $WF_6$ finds it extremely difficult to penetrate through TiN layers 301A and 301B. Thus, the present invention effectively minimizes any peel back of the TiN layer and, consequently, virtually eliminates any possibility of the formation of a tungsten volcano.

Figure 4:
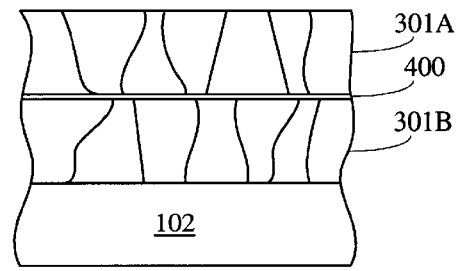
FIG. 4 illustrates another composition barrier metal layer in accordance with the present invention.

In one embodiment of the present invention shown in FIG. 4, an oxide layer 400 is formed between the two TiN layers 301. In one implementation, an air break between the deposition of TiN layer 301A and TiN layer 301B results in the formation of a native oxide layer between the two TiN layers. As known by those skilled in the art, a native oxide layer will form at room temperature, but the growth is self-limiting. In the present invention, the native oxide layer is formed to a thickness between 10 and 15 Å. In another implementation, the temperature is raised several hundred degrees. In this manner, the subsequent oxidation rate is much greater, and the "grown" oxide becomes denser and more durable. In the present invention, the grown oxide is formed to a thickness between 20 Å and 50 Å. In either implementation, oxide layer 400 provides an additional diffusion barrier to $WF_6$ penetration. Moreover, oxide layer 400 acts as a glue between the two TiN layers. Therefore, the present invention is stronger, i.e. has less defects and pinholes, than prior art barrier metal layers.

In yet another embodiment, an anneal at 400° C. for 30 minutes with nitrogen is performed after deposition of one or both TiN layers 301. This anneal accelerates the movement of the elements (i.e. grains) of layers 301 and 302 to their final equilibrium placement, thereby potentially strengthening the barrier metal layer.

The present invention also provides a thinner barrier metal layer than that of the prior art. Specifically, TiN layer 103 is typically formed to a thickness of 1000 Å. In accordance with the present invention, each of TiN layers 301 and 302 is formed to a thickness of between 150 Å and 450 Å. One embodiment provides a thickness of 300 Å. Thus, the present invention can significantly reduce the thickness of the barrier metal layer. Advantageously, a thinner barrier metal layer reduces the mechanical stresses in the TiN, thereby reducing the probability of defects in that material.

Note that Ti layer 102, all underlying structures, and tungsten layer 104, are formed to standard thicknesses. For example, in a standard embodiment, Ti layer 102 is formed to a thickness of 85 Å. Moreover, the present invention uses only standard CMOS processes, thereby not adding complicated and/or expensive steps to the device fabrication.

In summary, the present invention provides a thin and strong barrier metal layer with minimal barrier failures. Although certain embodiments have been described herein, modifications to those embodiments will be apparent to those skilled in the art. For example, although the present invention is described in embodiments having contact windows formed on silicon, the present invention is equally applicable to vias formed on metal or other surfaces. Furthermore, the present invention is not limited to the titanium-nitride as a barrier metal layer. In fact, the present invention can be used with many different barrier metals. Therefore, the present invention is limited only by the appended claims.

What is claimed is:

1. A barrier metal layer provided in an opening of an integrated circuit, the opening including a base and sidewalls, the barrier metal layer formed between a titanium layer and a tungsten layer in a semiconductor device, the titanium layer substantially following contours of the base and the sidewalls of the opening, the barrier metal layer including:

a first titanium-nitride layer having a first grain boundary, the first titanium-nitride layer being formed on the titanium layer and substantially following contours of the titanium layer in the opening; and a second titanium-nitride layer having a second grain boundary, the second titanium-nitride layer being formed above and substantially following contours of the first titanium-nitride layer in the opening, the tungsten layer being formed on the second titanium-nitride layer.

2. The barrier metal layer of claim 1 further including an oxide layer formed between the first titanium-nitride layer and the second titanium-nitride layer.

3. The barrier metal layer of claim 2, wherein the oxide layer is a native oxide layer.

4. The barrier metal layer of claim 3, wherein the native oxide layer is formed to a thickness between approximately 10 Å and 15 Å.

5. The barrier metal layer of claim 2 wherein the oxide layer is a grown oxide layer.

6. The barrier metal layer of claim 5, wherein the grown oxide layer is formed to a thickness between 20 and 50 Å.

7. The barrier metal layer of claim 1, wherein the first titanium-nitride layer has a thickness between approximately 150 and 450 Å.

8. The barrier metal layer of claim 1, wherein the second titanium-nitride layer has a thickness between approximately 150 and 450 Å.

9. The barrier metal layer of claim 1, wherein the first titanium-nitride layer and the second titanium-nitride layer each have a thickness of approximately 300 Å.

10. A composite barrier metal layer provided in an opening of an integrated circuit, the opening including a base and sidewalls, the composite barrier metal layer formed between a titanium layer and a refractory metal layer in a semiconductor device, the titanium layer substantially following contours of the base and the sidewalls of the opening, the composite barrier metal layer including:

a first layer having a first grain boundary, the first layer being formed on the titanium layer and substantially following contours of the titanium layer in the opening; and a second layer having a second grain boundary, the second layer being formed above and substantially following contours of the first layer in the opening, the refractory layer being formed on the second layer, wherein the first layer and the second layer are formed from the same barrier metal.

11. The composite barrier metal layer of claim 10 further including an oxide layer formed between the first layer and the second layer.

12. The composite barrier metal layer of claim 11, wherein the oxide layer is a native oxide layer.

13. The composite barrier metal layer of claim 12, wherein the native oxide layer is formed to a thickness between approximately 10 and 15 Å.

14. The composite barrier metal layer of claim 11 wherein the oxide layer is a grown oxide layer.

15. The composite barrier metal layer of claim 14, wherein the grown oxide layer is formed to a thickness between approximately 20 and 50 Å.

16. The composite barrier metal layer of claim 10, wherein the first layer has a thickness between approximately 150 and 450 Å.

17. The composite barrier metal layer of claim 10, wherein the second layer has a thickness between approximately 150 and 450 Å.

18. The composite barrier metal layer of claim 10, wherein the first layer and the second layer each have a thickness of approximately 300 Å.

* * * * *